(12) United States Patent
Kim et al.

(10) Patent No.: US 10,192,831 B1
(45) Date of Patent: Jan. 29, 2019

(54) FAN-OUT SEMICONDUCTOR PACKAGE MODULE

(71) Applicant: SAMSUNG ELECTRO-MECHANICS CO., LTD., Suwon-Si, Gyeonggi-Do (KR)

(72) Inventors: Hyung Joon Kim, Suwon-Si (KR); Han Kim, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/933,909

(22) Filed: Mar. 23, 2018

(30) Foreign Application Priority Data

Sep. 27, 2017 (KR) ........................ 10-2017-0125282

(51) Int. Cl.
*H01L 23/552* (2006.01)
*H01L 23/538* (2006.01)
(Continued)

(52) U.S. Cl.
CPC ...... *H01L 23/5389* (2013.01); *H01L 23/3114* (2013.01); *H01L 23/367* (2013.01);
(Continued)

(58) Field of Classification Search
CPC ....... H01L 2924/00014; H01L 2924/00; H01L 2224/16225; H01L 2224/97; H01L 2924/181; H01L 2224/48091; H01L 2924/00012; H01L 2924/15311; H01L 2224/13111; H01L 2924/1306; H01L 2224/81; H01L 2924/014; H01L 2224/94; H01L 2924/0002; H01L 2224/13116; H01L 2224/13124; H01L 2224/13139; H01L 2224/13144; H01L 2224/13147; H01L 2224/13155; H01L 2924/01082;
(Continued)

(56) References Cited

U.S. PATENT DOCUMENTS 8,736,033 B1 * 5/2014 Chuo .................... H01L 23/552
 257/659
9,271,436 B2 * 2/2016 Chen .................... H05K 13/046
(Continued)

FOREIGN PATENT DOCUMENTS

KR 10-2016-0132749 A 11/2016

*Primary Examiner* — Robert G Bachner
(74) *Attorney, Agent, or Firm* — McDermott Will & Emery LLP

(57) ABSTRACT

A fan-out semiconductor package module includes: a core member having first and second through-holes spaced apart from each other and one or more slits; a semiconductor chip disposed in the first through-hole; one or more first passive components disposed in the second through-hole; an encapsulant encapsulating at least portions of each of the core member, an inactive surface of the semiconductor chip, and the one or more first passive components; a connection member disposed on the core member, an active surface of the semiconductor chip, and the one or more first passive components and including redistribution layers electrically connected to the connection pads and the one or more first passive component; and first metal layers filling the one or more slits. At least one of the one or more slits is formed between the first and second through-holes.

16 Claims, 22 Drawing Sheets

(51) Int. Cl.
*H01L 23/31* (2006.01)
*H01L 23/367* (2006.01)
*H01L 23/00* (2006.01)

(52) U.S. Cl.
CPC ...... *H01L 23/5383* (2013.01); *H01L 23/5386* (2013.01); *H01L 23/552* (2013.01); *H01L 24/20* (2013.01); *H01L 2224/214* (2013.01); *H01L 2924/19105* (2013.01); *H01L 2924/3025* (2013.01)

(58) Field of Classification Search
CPC . H01L 2924/07811; H01L 2924/12042; H01L 2224/48227; H01L 2924/12041; H01L 2224/05552; H01L 2924/3025; H01L 2224/0401; H01L 2224/131
See application file for complete search history.

(56) References Cited

U.S. PATENT DOCUMENTS

| | | | |
|---|---|---|---|
| 2010/0013064 A1* | 1/2010 | Hsu | H01L 23/055 257/660 |
| 2016/0336249 A1* | 11/2016 | Kang | H01L 23/3128 |
| 2017/0287825 A1* | 10/2017 | Lee | H01L 23/49827 |
| 2018/0286790 A1* | 10/2018 | Cho | H01L 23/49503 |

* cited by examiner

FAN-OUT SEMICONDUCTOR PACKAGE MODULE

CROSS-REFERENCE TO RELATED APPLICATION(S)

This application claims benefit of priority to Korean Patent Application No. 10-2017-0125282 filed on Sep. 27, 2017 in the Korean Intellectual Property Office, the disclosure of which is incorporated herein by reference in its entirety.

TECHNICAL FIELD

The present disclosure relates to a fan-out semiconductor package module in which at least one semiconductor chip and a plurality of passive components are encapsulated in a single package.

BACKGROUND

In accordance with an increase in a size of displays for mobile apparatuses, the necessity to increase the capacity of batteries has increased. In accordance with increases in the capacity of batteries, areas occupied by the batteries of mobile apparatuses have increased, and it has thus been required to reduce a size of a printed circuit board (PCB). Therefore, an area in which components are mounted has reduced, such that interest in modularization has continuously increased.

Meanwhile, an example of the related art of mounting a plurality of components may include chip-on-board (COB) technology. COB is a method of mounting individual passive elements and a semiconductor package on a printed circuit board using surface mount technology (SMT). Such a manner has an advantage in terms of cost, but a wide mounting area is required in order to maintain a minimum interval between components, electromagnetic interference (EMI) between the components is large, and a distance between the semiconductor chip and the components is great, such that electrical noise is increased.

SUMMARY

An aspect of the present disclosure may provide a fan-out semiconductor package module in which a mounting area may be significantly reduced, electrical paths between a semiconductor chip and a plurality of passive components may be significantly reduced, and electromagnetic interference (EMI) may be easily blocked through plating by disposing and modularizing the plurality of passive components together with the semiconductor chip in a single package.

According to an aspect of the present disclosure, a fan-out semiconductor package module may be provided, in which a core member having a plurality of through-holes are introduced, a plurality of passive components and a semiconductor chip are disposed in the respective through-holes and are modularized in a single package, and one or more slits filled with metal layers are formed between the respective through-holes to block EMI.

According to an aspect of the present disclosure, a fan-out semiconductor package module may include: a core member having first and second through-holes spaced apart from each other and one or more slits; a semiconductor chip disposed in the first through-hole and having an active surface having connection pads disposed thereon and an inactive surface opposing the active surface; one or more first passive components disposed in the second through-hole; an encapsulant encapsulating at least portions of each of the core member, the inactive surface of the semiconductor chip, and the one or more first passive components; a connection member disposed on the core member, the active surface of the semiconductor chip, and the one or more first passive components and including redistribution layers electrically connected to the connection pads and the one or more first passive component; and first metal layers filling the one or more slits, wherein at least one of the one or more slits is formed between the first and second through-holes.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or stylized for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure.

In this case, singular forms include plural forms unless interpreted otherwise in context.

Electronic Device

Figure 1:
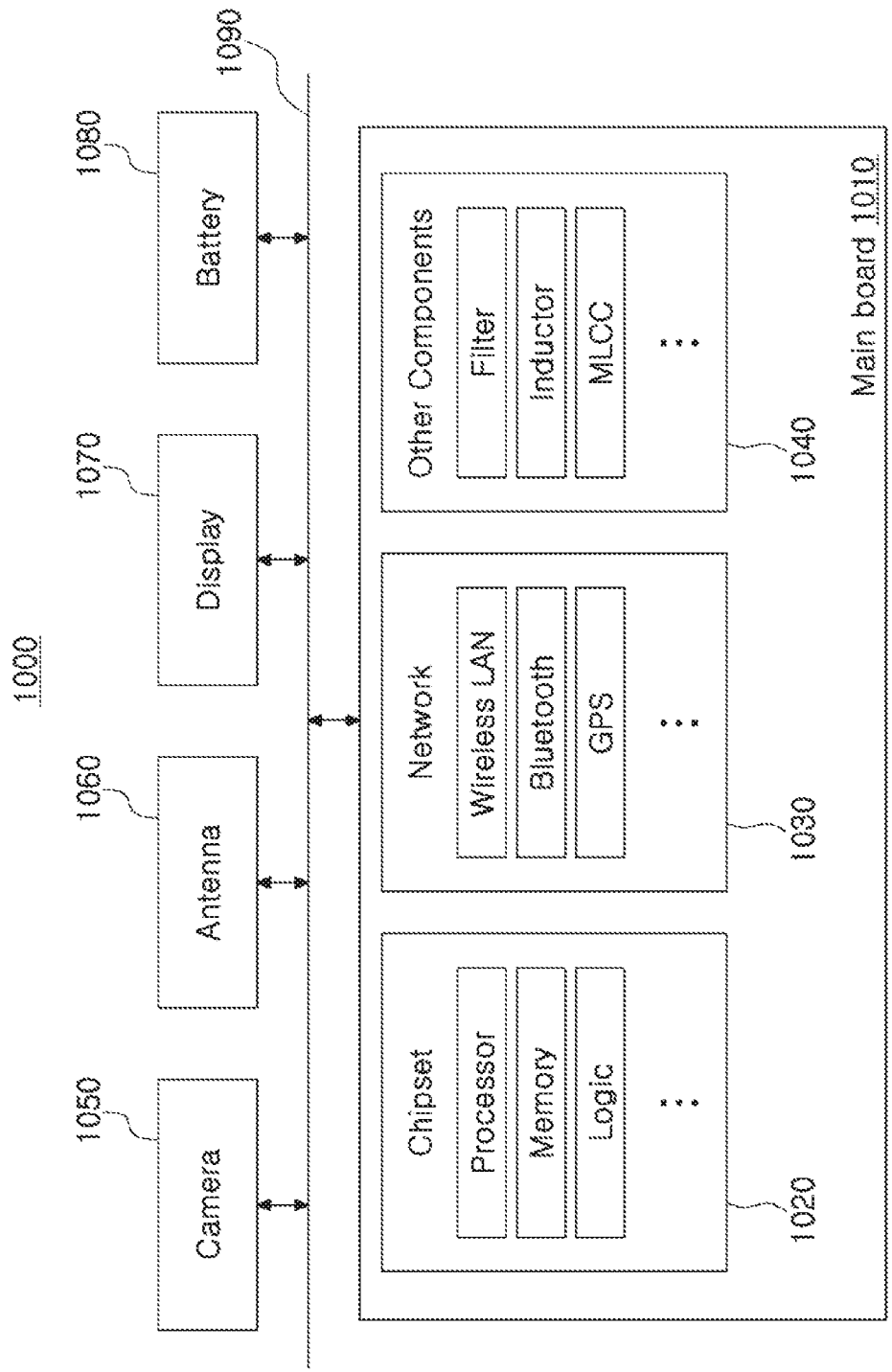
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
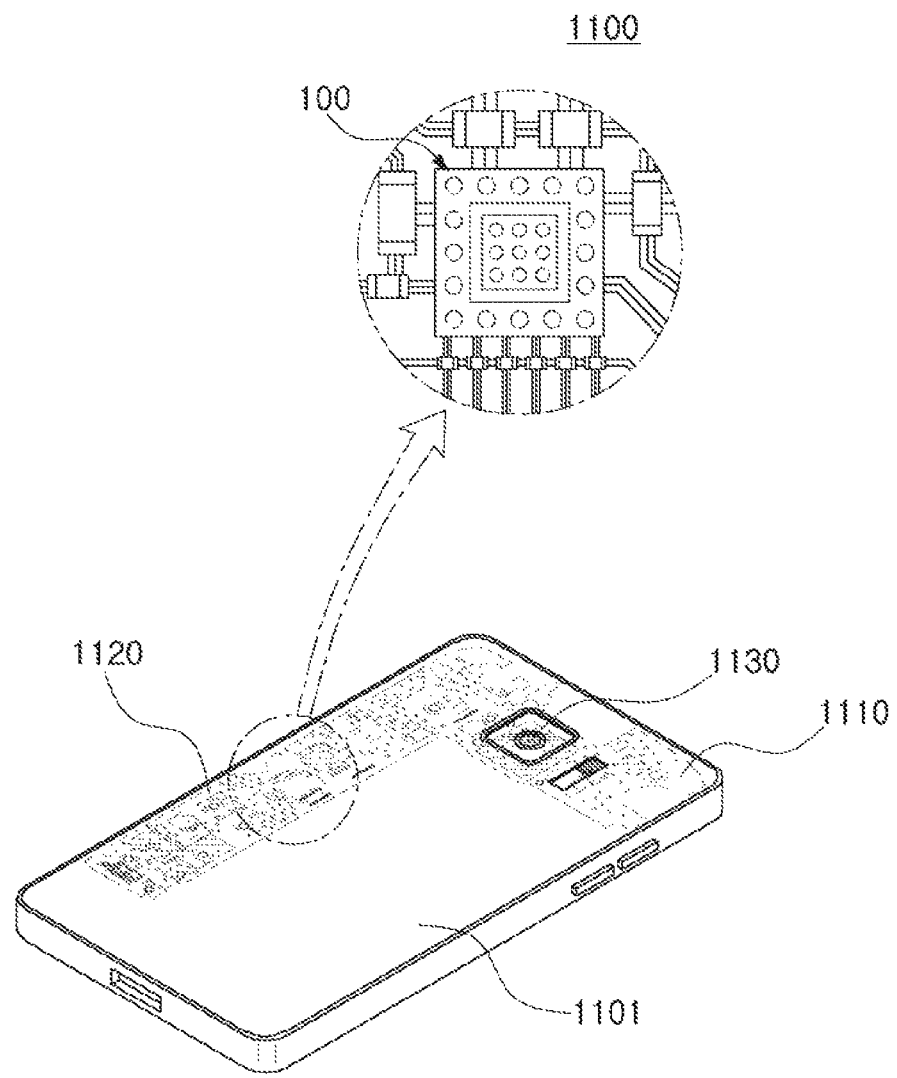
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1110, such as a camera module 1130, may be accommodated in the body 1101. Some of the electronic components 1120 may be the chip related components, and some of the chip related components may be a semiconductor package or a semiconductor package module 100 to be described below. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required, due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
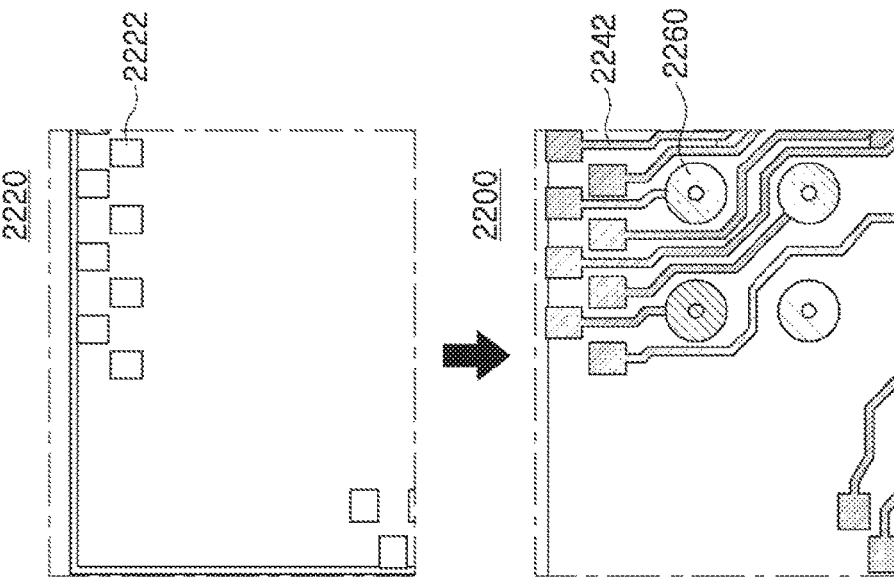
FIGS. 3A and 3B are schematic cross-sectional views illustrating states of a fan-in semiconductor package before and after being packaged.
Figure 3A:
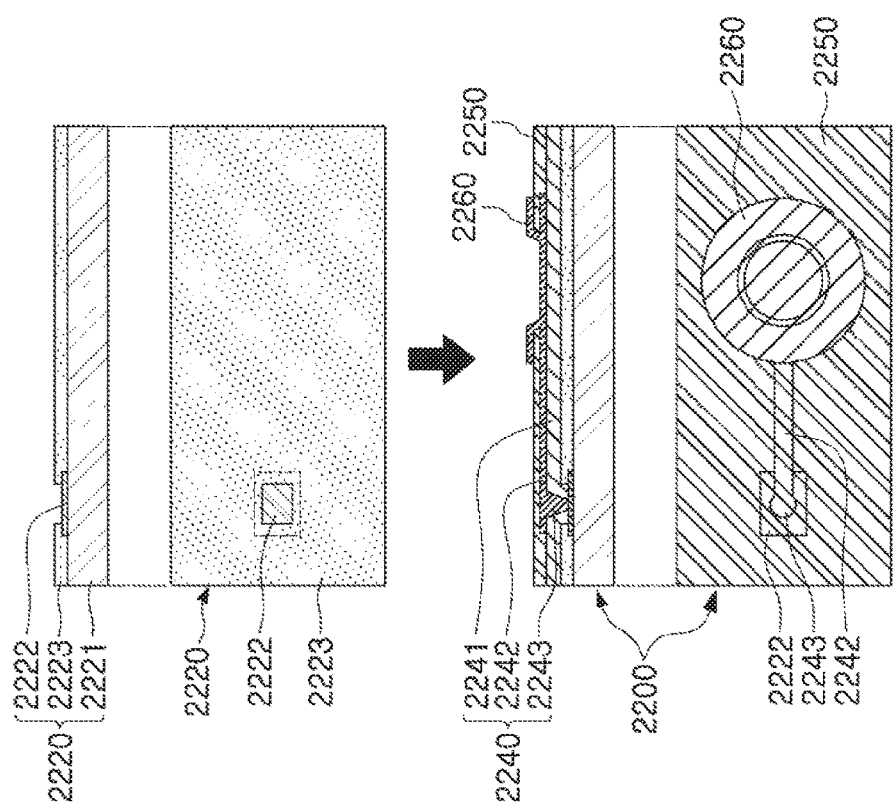

FIGS. 3A and 3B are schematic cross-sectional views illustrating states of a fan-in semiconductor package before and after being packaged.

Figure 4:
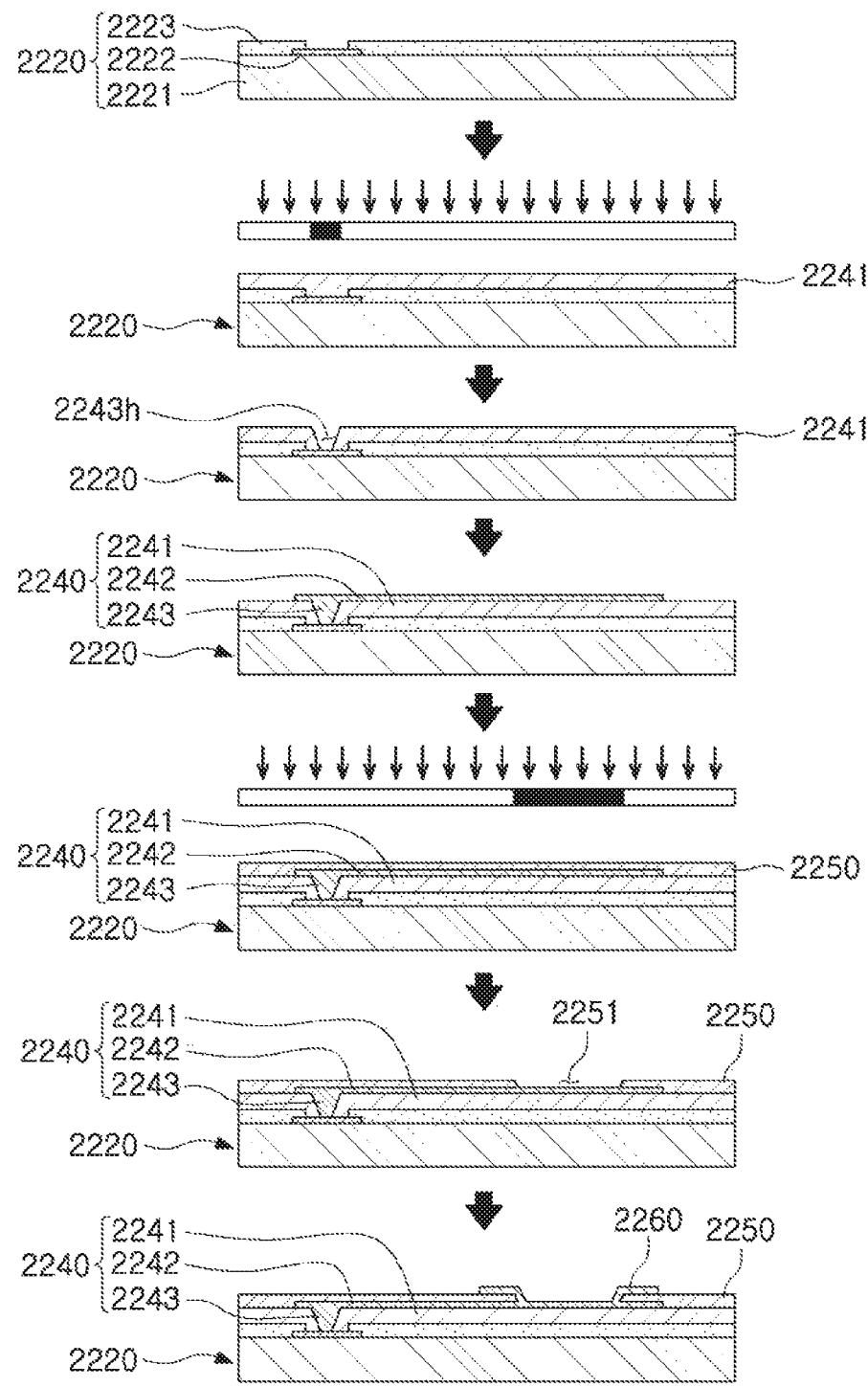
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations.

Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
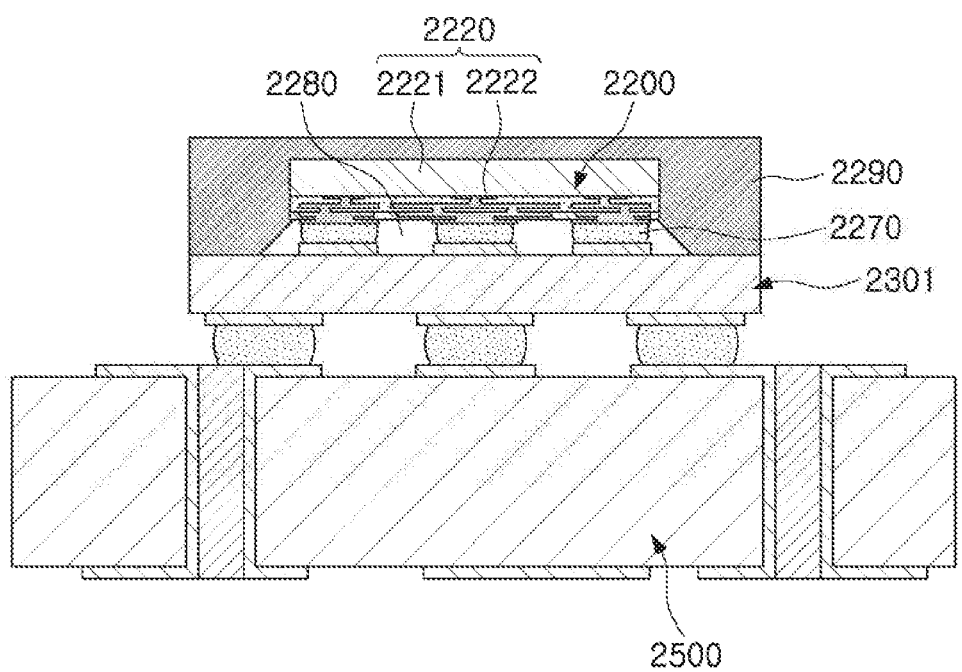
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
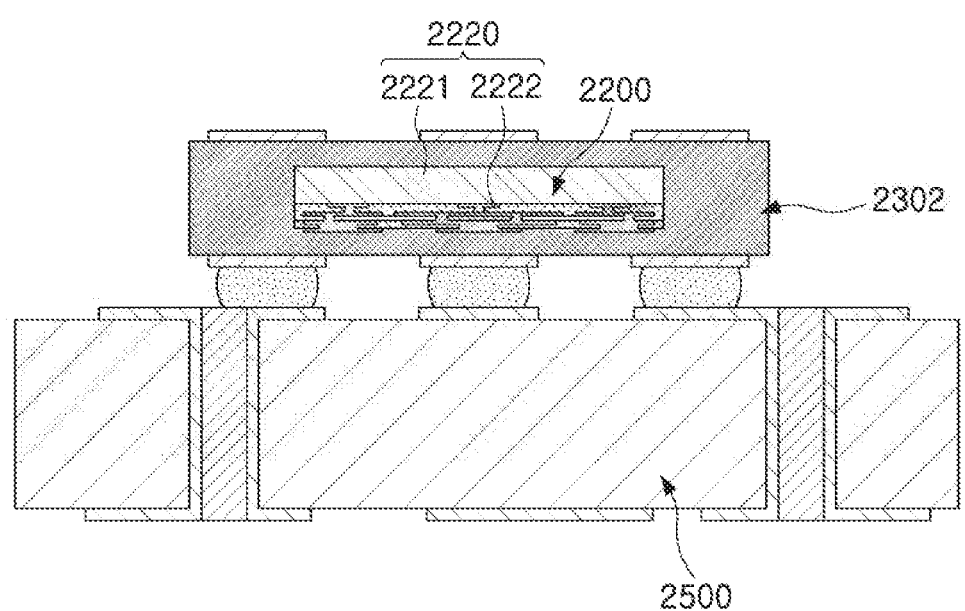
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
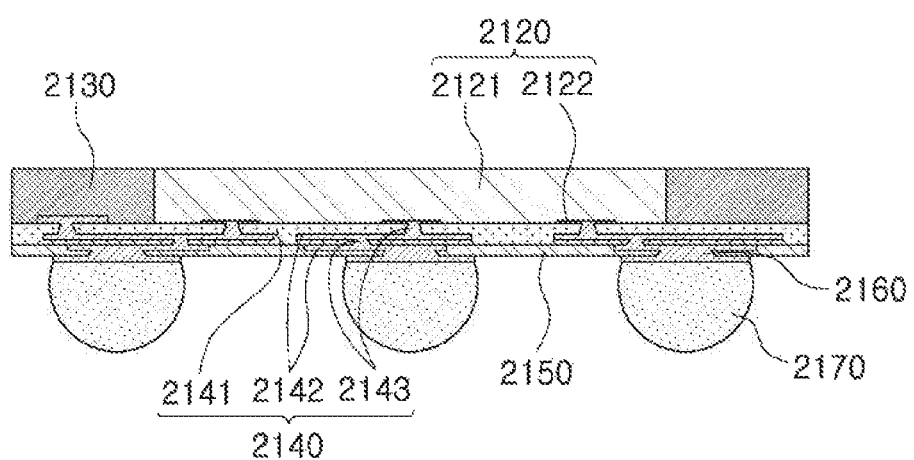
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
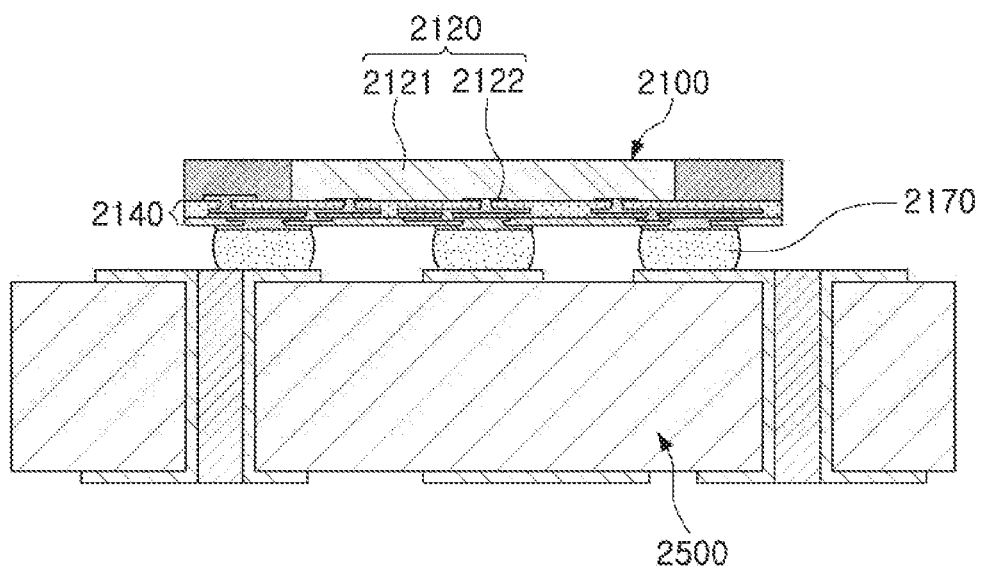
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Semiconductor Package Module

Figure 9:
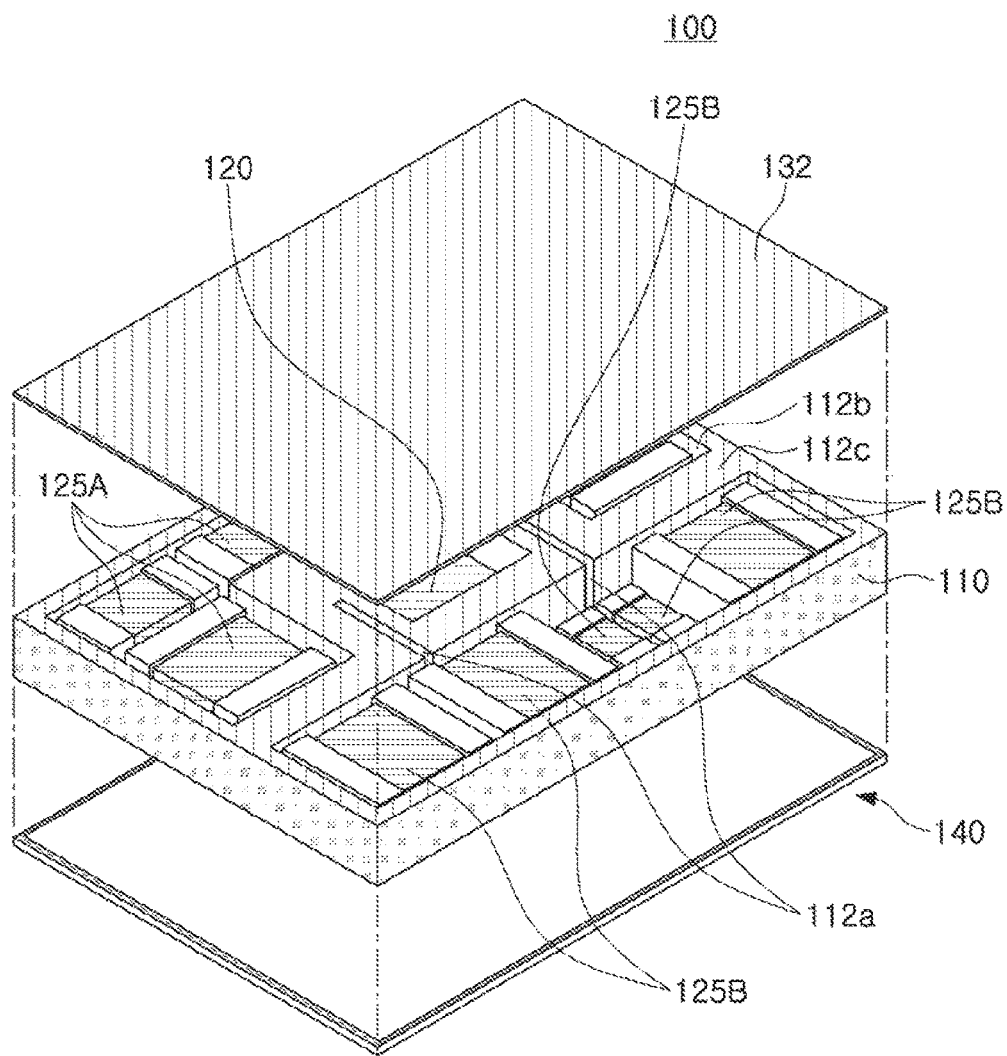
FIG. 9 is a schematic perspective view illustrating an example of a fan-out semiconductor package module.

FIG. 9 is a schematic perspective view illustrating an example of a fan-out semiconductor package module.

Figure 10:
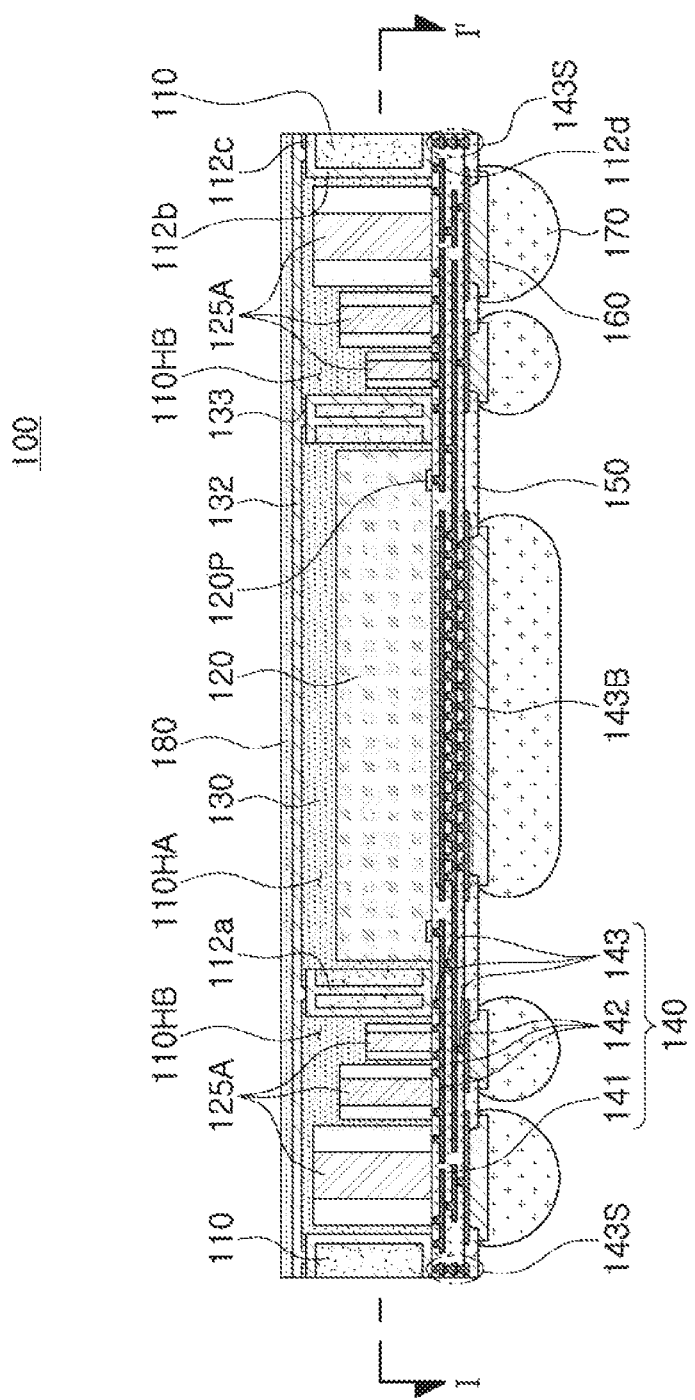
FIG. 10 is a schematic cross-sectional view of the fan-out semiconductor package module of FIG. 9.

FIG. 10 is a schematic cross-sectional view of the fan-out semiconductor package module of FIG. 9.

Figure 11:
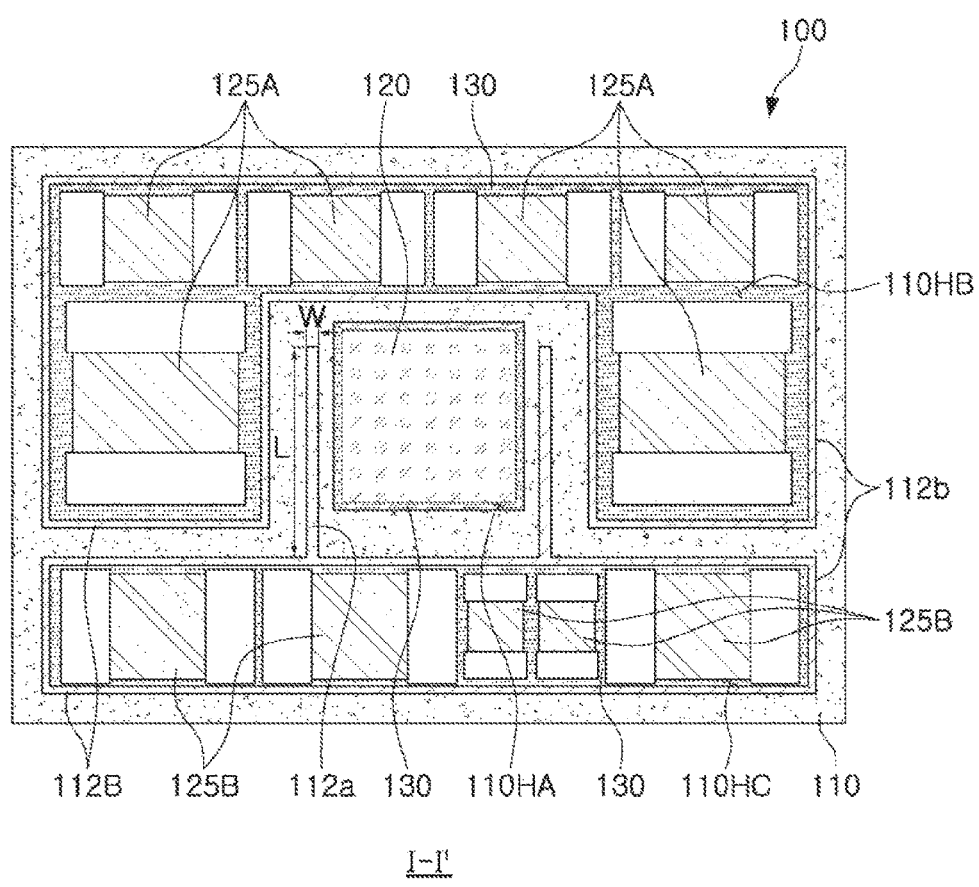
FIG. 11 is a schematic plan view taken along line I-I' of the fan-out semiconductor package module of FIG. 10.

FIG. 11 is a schematic plan view taken along line I-I' of the fan-out semiconductor package module of FIG. 10.

Figure 12:
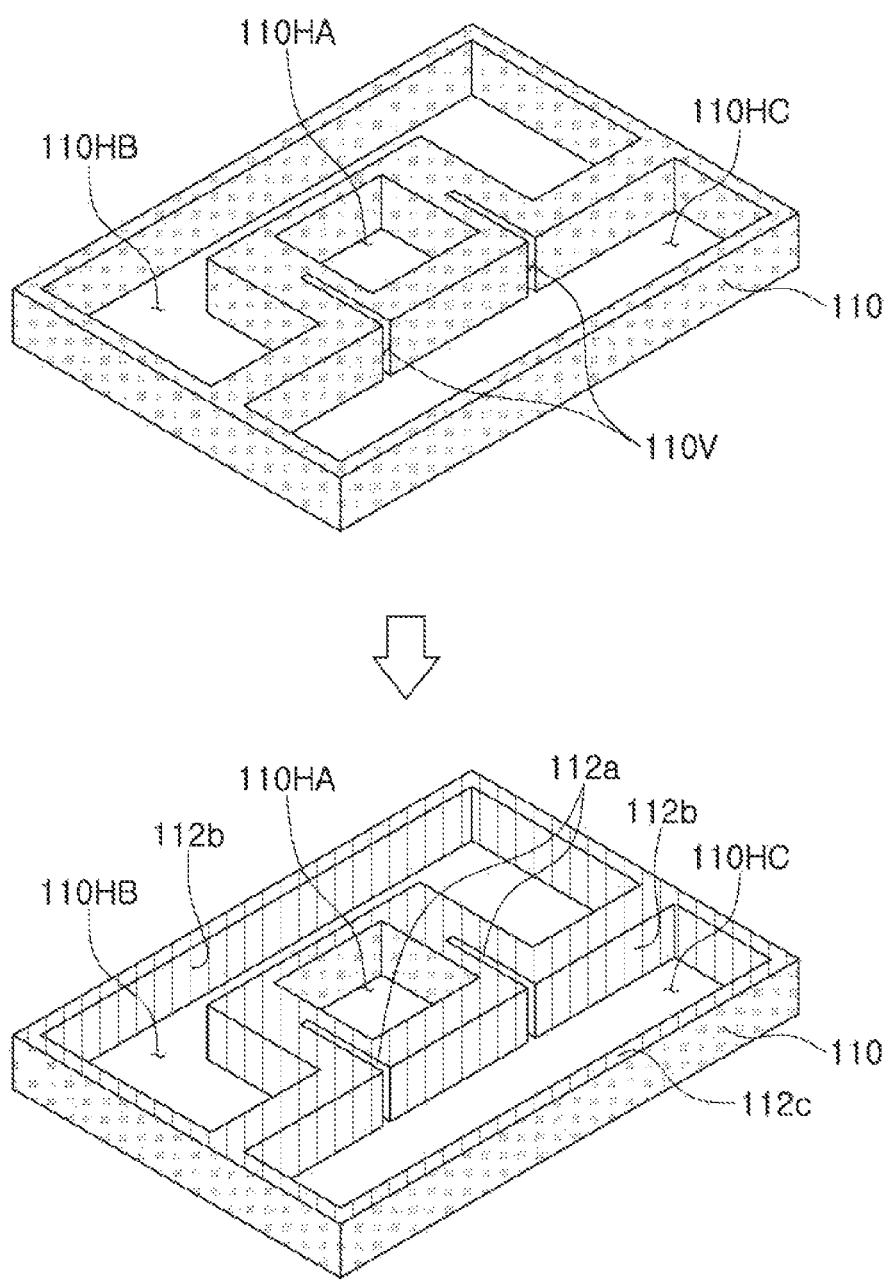
FIG. 12 is schematic views illustrating a process of forming metal layers in a core member of the fan-out semiconductor package module of FIG. 9.

FIG. 12 is schematic views illustrating a process of forming metal layers in a core member of the fan-out semiconductor package module of FIG. 9.

Referring to FIGS. 9 through 12, a fan-out semiconductor package module 100 according to an exemplary embodiment in the present disclosure may include a core member 110 having first to third through-holes 110HA, 110HB, and 110HC, a semiconductor chip 120 disposed in the first through-hole 110HA and having an active surface having connection pads 120P disposed thereon and an inactive surface opposing the active surface, one or more first passive components 125A disposed in the second through-hole 110HB, one or more second passive components 125B disposed in the third through-hole 110HC, an encapsulant 130 encapsulating at least portions of each of the core member 110, the inactive surface of the semiconductor chip 120, the first passive components 125A, and the second passive components 125B and filling at least portions of each of the first to third through-holes 110HA, 110HB, and 110HC, and a connection member 140 disposed on the core member 110, the active surface of the semiconductor chip 120, the first passive components 125A, and the second passive components 125B and including redistribution layers 142 electrically connected to the connection pads 120P, the first passive components 125A, and the second passive components 125B. If necessary, the fan-out semiconductor package module 100 may further include a passivation layer 150 disposed on the connection member 140, an underbump metal layer 160 formed in openings of the passivation layer 150 and electrically connected to the redistribution layer 142, and electrical connection structures 170 electrically connected to the redistribution layer 142 through the underbump metal layer 160.

The core member 110 may include one or more slits 110V disposed between the first and second through-holes 110HA and 110HB. The one or more slits 110V may penetrate through the core member 110. Each slit 110 may be a cut having a ratio of a length L thereof to a width W thereof in a plan view (e.g., a view along line I-I' shown in FIG. 11) greater than a predetermined value such as 1, 5, or 10, or greater. Each slit 110V may have two straight edges or two curved edges extending along a major surface of the core member 110. The two straight edges or the two curved edges may be parallel to each other. Each slit 110V may extend parallel to a wall of the first through-hole 110HA. First metal layers 112a may be disposed in the one or more slits 110V. Second metal layers 112b may be disposed on walls of the second and third through-holes 110HB and 110HC. Third and fourth metal layers 112c and 112d may be disposed on upper and lower surfaces of the core member 110, respectively. The first metal layers 112a may be connected to the second metal layers 112b formed on the wall of the third through-hole 110HC. The third and fourth metal layers 112c and 112d may be connected to the first and second metal layers 112a and 112b. A backside metal layer 132 may be disposed on the encapsulant 130. The backside metal layer 132 may be connected to the third metal layer 112c through backside vias 133 penetrating through at least portions of the encapsulant 130. A passivation layer 180 may be disposed on the backside metal layer 132.

Recently, in accordance with an increase in a size of displays for mobile apparatuses, the necessity of increasing battery capacity has increased. In accordance with the increase in the capacity of the battery, an area occupied by the battery in the mobile apparatus has increased, and it has been thus required to reduce a size of a PCB. Therefore, an area in which components are mounted has reduced, such that interest in modularization has continuously increased. An example of the related art of mounting a plurality of components may include chip on board (COB) technology. COB is a method of mounting individual passive elements and a semiconductor package on a printed circuit board using surface mount technology (SMT). Such a manner has an advantage in terms of a cost, but a wide mounting area is required in order to maintain a minimum interval between components, electromagnetic interference (EMI) between the components is high, and a distance between the semiconductor chip and the components is great, such that electrical noise is increased.

On the other hand, in the fan-out semiconductor package module 100 according to the exemplary embodiment, a plurality of passive components 125A and 125B and the semiconductor chip 120 may be disposed in a single package. Therefore, an interval between the components may be significantly reduced, and a mounting area of the components on a printed circuit board, or the like, may thus be significantly reduced. In addition, electrical paths between the semiconductor chip 120 and the passive components 125A and 125B may be significantly reduced to suppress noise. Particularly, the semiconductor chip 120 and the plurality of passive components 125A and 125B may be disposed in separate through-holes 110HA, 110HB, and 110HC, respectively, and the slits 110V may be formed between specific through-holes 110HA and 110HB and be then filled with the metal layers 112a to block EMI related to the semiconductor chip 120. In addition, since the metal layers 112b may be disposed on the walls of the through-holes 110HB and 110HC in which the plurality of passive components 125A and 125B are disposed, EMI related to the plurality of passive components 125A and 125B may also be blocked. In addition, the metal layer 112c formed on the upper surface of the core member 110 may be connected to the backside metal layer 132 through the backside vias 133. Resultantly, EMI above the semiconductor chip 120 and the plurality of passive components 125A and 125B may also be blocked.

Meanwhile, metal layer plating may not be performed on walls of the first through-hole 110HA in which the semiconductor chip 120 is disposed. That is, the walls of the first through-hole 110AH may be in contact with the encapsulant 130. This may be implemented by forming the second and third through-holes 110HB and 110HC, performing plating to form the first to fourth metal layers 112a, 112b, 112c, and 112d, disposing the plurality of passive components 125A and 125B, forming the first through-hole 110HA in the absence of a defect, and then disposing the semiconductor chip 120. Alternatively, this may be implemented by forming the first to third through-holes 110HA, 110HB, and 110HC, performing plating in a state in which the first through-hole 110HA is closed with a dry film, or the like, to form the first to fourth metal layers 112a, 112b, 112c, and 112d, disposing the plurality of passive components 125A and 125B, opening the first through-hole 110HA in the absence of a defect, and then disposing the semiconductor chip 120. This may also be implemented by various other methods. In a case of the passive components 125A and 125B, a surface mounted process is relatively easy, but in a case of the semiconductor chip 120, a surface mounted process is relatively difficult. For example, the surface mounted process of the semiconductor chip 120 requires high precision and a clean environment. Therefore, when a process of mounting and encapsulating the passive components 125A and 125B and a process of mounting and encapsulating the semiconductor chip 120 are separately performed, a mounted yield, an influence by foreign materials, or the like, between the passive components 125A and 125B and the semiconductor chip 120 may be significantly reduced. Particularly, the semiconductor chip 120 that is relatively expensive may only be mounted in separate good units by a precise process after the passive components 125A and 125B are mounted, such that a yield may be improved.

The respective components included in the fan-out semiconductor package module 100 according to the exemplary embodiment will hereinafter be described in more detail.

The core member 110 may improve rigidity of the fan-out semiconductor package module 100 depending on certain materials, and serve to secure uniformity of a thickness of the encapsulant 130. The core member 110 may have a plurality of through-holes 110HA, 110HB, and 110HC. The semiconductor chip 120, one or more passive components 125A, and one or more passive components 125B may be disposed in the plurality of through-holes 110HA, 110HB, and 110HC, respectively. The semiconductor chip 120, one or more passive components 125A, and one or more passive components 125B may be spaced apart from the walls of the through-holes 110HA, 110HB, and 110HC by predetermined distances and may be surrounded by the walls of the through-holes 110HA, 110HB, and 110HC. However, the core member may be modified, if necessary. If necessary, only the first and second through-holes 110HA and 110HB may be formed in the core member.

A material of the core member 110 is not particularly limited. For example, an insulating material may be used as the material of the core member 110. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The core member 110 may include one or more slits 110V disposed between the first and second through-holes 110HA and 110HB and connected to the third through-hole 110HC. The slits 110V may be filled with the first metal layers 112a, and the first metal layers 112a may be disposed to surround at least portions of side surfaces of the semiconductor chip 120a. The second metal layers 112b may be disposed on the walls of the second and third through-holes 110HB and 110HC of the core member 110, and may be disposed to surround the passive components 125A and 125B. The third and fourth metal layers 112c and 112d may be disposed on the upper and lower surfaces of the core member 110, respectively, and may be connected to the first and second metal layers 112a and 112b. The EMI of the semiconductor chip 120 and the passive components 125A and 125B may be blocked through the first to fourth metal layers 112a, 112b, 112c, and 112d. The first to fourth metal layers 112a, 112b, 112c, and 112d may be ground (GND) patterns. In this case, the first to fourth metal layers 112a, 112b, 112c, and 112d may be connected to ground patterns of the redistribution layer 142 of the connection member 140. A material of each of the first to fourth metal layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The first to fourth metal layers 112a, 112b, 112c, and 112d may be formed by a plating process.

Redistribution layers and vias may be formed in the core member 110, if necessary. In this case, insulating layers may be multiple layers. That is, a form of the core member 110 may be variously modified. For example, the core member 110 may include a first insulating layer, a first redistribution layer embedded in the first insulating layer and in contact with the connection member 140, a second redistribution layer disposed on the other surface of the first insulating layer opposing one surface of the first insulating layer on which the first redistribution layer is disposed, a second insulating layer disposed on the first insulating layer and covering at least portions of the second redistribution layer, a third redistribution layer disposed on the second insulating layer, first vias penetrating through the first insulating layer and electrically connecting the first and second redistribution layers to each other, and second vias penetrating through the second insulating layer and electrically connecting the second and third redistribution layers to each other. Alternatively, the core member 110 may include a first insulating layer, first and second redistribution layers disposed on opposite surfaces of the first insulating layer, respectively, a second insulating layer disposed on the first insulating layer and covering at least portions of the first redistribution layer, a third insulating layer disposed on the other surface of the first insulating layer opposing one surface of the first insulating layer on which the second insulating layer is disposed and covering at least portions of the second redistribution layer, a third redistribution layer disposed on the second insulating layer and in contact with the connection member 140, a fourth redistribution layer disposed on the third insulating layer, first vias penetrating through the first insulating layer and electrically connecting the first and second redistribution layers to each other, second vias penetrating through the second insulating layer and electrically connecting the first and third redistribution layers to each other, and third vias penetrating through the third insulating layer and electrically connecting the second and fourth redistribution layers to each other. Meanwhile, the redistribution layers of the core member 110 as described above may have a thickness greater than that of the redistribution layer 142 of the connection member 140. The core member 110 having such a form may allow the fan-out semiconductor package module to be easily used as a package-on-package (PoP) type.

The semiconductor chip 120 may be an integrated circuit (IC) provided in an amount of several hundred to several million or more elements integrated in a single chip. In this case, the integrated circuit may be, for example, a power management IC (PMIC), but is not limited thereto. Meanwhile, the semiconductor chip may be an integrated circuit in a bare state in which a separate bump or redistribution layer is not formed. The integrated circuit may be formed on the basis of an active wafer. In this case, a base material of a body of the semiconductor chip may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer (not illustrated) exposing the connection pads 120P may be formed on the body, and may be an oxide film, a nitride film, or the like, or a double layer of an oxide layer and a nitride layer. An insulating layer (not illustrated), and the like, may be further disposed in other required positions.

The plurality of passive components 125A and 125B may be multilayer ceramic capacitors (MLCCs), low inductance chip capacitors (LICCs), inductors, beads, or various other kinds of filters, or the like, respectively. The respective passive components 125A and 125B may have different sizes. In addition, the respective passive components 125A and 125B may have a thickness different from that of the semiconductor chip 120. In the fan-out semiconductor package module 100 according to the exemplary embodiment, the passive components 125A and 125B may be encapsulated in different through-holes 110HB and 110HC and a defect due to a thickness deviation may thus be significantly reduced. The number of passive components 125A and 125B is not particularly limited, and may be more than that illustrated in the drawings or less than that illustrated in the drawings.

The encapsulant 130 may encapsulate at least portions of the core member 110, the semiconductor chip 120, and the plurality of passive components 125A and 125B. In addition, the encapsulant 130 may fill at least portions of the through-holes 110HA, 110HB, and 110HC. The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. In addition, the known molding material such as an epoxy molding compound (EMC), or the like, may be used, and a photoimagable encapsulant (PIE) may be used, if necessary. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material. The second metal layers 112b may not be formed on the walls of the first through-hole 110HA. Therefore, the walls of the first through-hole 110HA may be in contact with the encapsulant 130. In this case, it may be expected to improve the yield as described above.

The backside metal layer 132 may cover an upper portion of the encapsulant 130. The backside metal layer 132 may have a plate form. The backside metal layer 132 may be connected to the third metal layer 112c through the backside vias 133 penetrating through at least portions of the encapsulant 130. The backside metal layer 132 may also be used as a ground. A material of each of the backside metal layer 132 and the backside vias 133 may be a conductive material such as copper (Cu), aluminum (Al), silver (Ag), tin (Sn), gold (Au), nickel (Ni), lead (Pb), titanium (Ti), or alloys thereof. The backside metal layer 132 and the backside vias 133 may be formed by a plating process.

The connection member 140 may redistribute the connection pads 120P of the semiconductor chip 120. In addition, the connection member 140 may electrically connect the semiconductor chip 120 and the passive components 125A and 125B to each other. Several tens to several hundreds of connection pads 120P of the semiconductor chip 120 having various functions may be redistributed by the connection member 140, and may be physically or electrically externally connected through the electrical connection structures 170 depending on the functions. The connection member 140 may include insulating layers 141, the redistribution layers 142 disposed on the insulating layers 141, and vias 143 penetrating through the insulating layers 141 and connecting the redistribution layers 142 to each other. The connection member 140 may be formed of a single layer, or may be formed of a plurality of layers of which the number is greater than that illustrated in the drawings.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 120P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals with the exception of the ground (GND) patterns, the power (PWR) patterns, and the like, such as data signals, and the like. In addition, the redistribution layers 142 may include via pads, connection terminal pads, and the like.

The vias 143 may electrically connect the redistribution layers 142, the connection pads 120P, or the like, formed on different layers to each other, resulting in an electrical path in the fan-out semiconductor package module 100. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have any shape known in the related art, such as a tapered shape, a cylindrical shape, and the like.

The connection member 140 may include a heat dissipation structure 143B disposed on the active surface of the semiconductor chip 120. The heat dissipation structure 143B may have a stack via form, but is not limited thereto. The heat dissipation structure 143B may be connected to the mainboard through the electrical connection structures 170 to effectively dissipate heat generated from the semiconductor chip 120.

The connection member 140 may have a blocking structure 143S surrounding the redistribution layers 142. The blocking structure 143S may be formed along an edge of the connection member 140. The blocking structure 143S may have a stack via form, but is not limited thereto. The blocking structure 143S may be connected to the fourth metal layer 112d, but is not limited thereto. EMI generated from the redistribution layers 142 or EMI introduced from an external apparatus into the redistribution layers 142 may be effectively blocked through the blocking structure 143S.

The passivation layer 150 may protect the connection member 140 from external physical or chemical damage. The passivation layer 150 may have the openings exposing at least portions of the redistribution layer 142 of the connection member 140. The number of openings formed in the passivation layer 150 may be several tens to several thousands. The passivation layer 150 may include an insulating resin and an inorganic filler, but may not include a glass fiber. For example, the passivation layer 150 may be formed of ABF, but is not limited thereto.

The underbump metal layer 160 may improve connection reliability of the electrical connection structures 170 to improve board level reliability of the fan-out semiconductor package module 100. The underbump metal layer 160 may be connected to the redistribution layer 142 of the connection member 140 exposed through the openings of the passivation layer 150. The underbump metal layer 160 may be formed in the openings of the passivation layer 150 by the known metallization method using the known conductive material such as a metal, but is not limited thereto.

The electrical connection structures 170 may be additionally configured to physically or electrically externally connect the fan-out semiconductor package module 100. For example, the fan-out semiconductor package module 100 may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, and may be sufficiently modified, depending on design particulars, by those skilled in the art. For example, the electrical connection structures 170 may be provided in an amount of several tens to several thousands according to the number of connection pads 120P, or may be provided in an amount of several tens to several thousands or more or several tens to several thousands or less.

At least one of the electrical connection structures 170 may be disposed in a fan-out region. The fan-out region refers to a region with the exception of a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The passivation layer 180 may protect the backside metal layer 132 from external physical or chemical damage. The passivation layer 180 may include an insulating resin and an inorganic filler, but may not include a glass fiber. For example, the passivation layer 180 may be formed of ABF, but is not limited thereto.

FIGS. 13A through 13H are schematic plan views illustrating various examples of the core member of the fan-out semiconductor package module of FIG. 9.

Figure 13A:
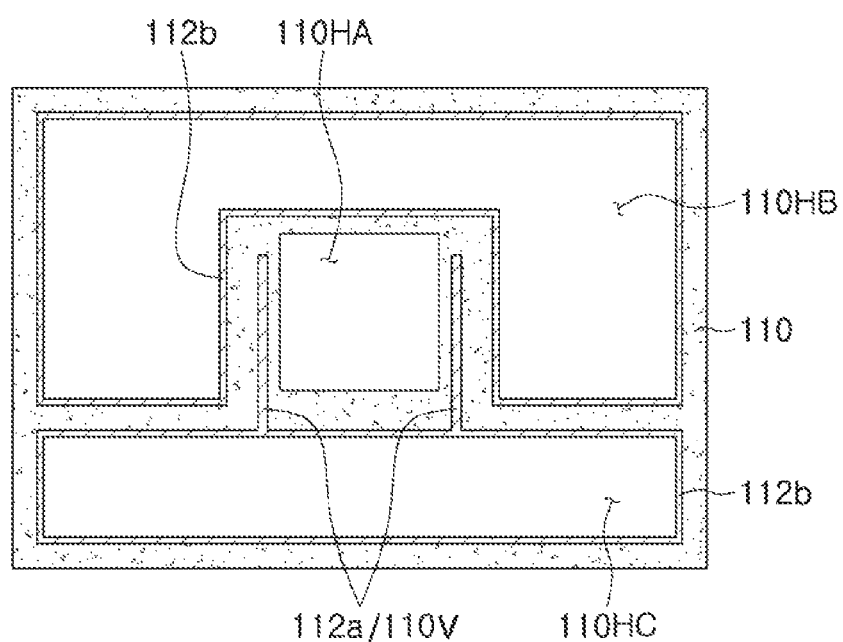
FIGS. 13A through 13H are schematic plan views illustrating various example of the core member of the fan-out semiconductor package module of FIG. 9.

Referring to FIG. 13A, a core member 110 may have first to third through-holes 110HA, 110HB, and 110HC. In this case, second metal layers 112b may be formed on walls of the second and third through-holes 110HB and 110HC, and a plurality of first metal layers 112a, filling slits 110V in the core member 110, connected to the second metal layers 112b formed on the walls of the third through-hole 110HC, and spaced apart from each other, may be formed between the first and second through-holes 110HA and 110HB. A semiconductor chip 120 may be disposed in the first through-hole 110HA, and a plurality of passive components 125A and 125B may be disposed in the second and third through-holes 110HB and 110HC, respectively.

Figure 13B:
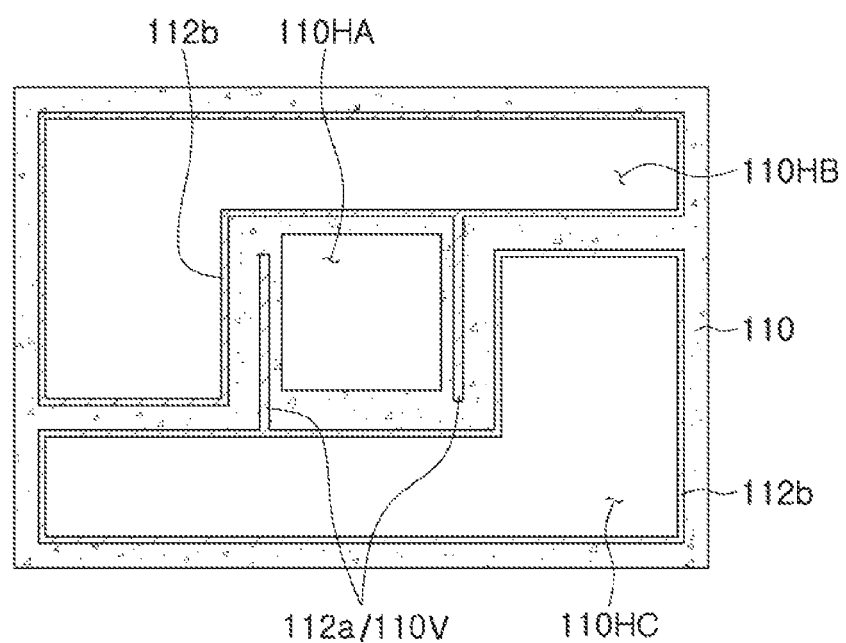

Referring to FIG. 13B, a core member 110 may have first to third through-holes 110HA, 110HB, and 110HC. In this case, second metal layers 112b may be formed on walls of the second and third through-holes 110HB and 110HC, and first metal layers 112a, filling slits 110V in the core member 110 and connected to the second metal layers 112b formed on the walls of the third through-hole 110HC and the second through-hole 110HB, may be formed between the first and second through-holes 110HA and 110HB and between the first and third through-holes 110HA and 110HC. A semiconductor chip 120 may be disposed in the first through-hole 110HA, and a plurality of passive components 125A and 125B may be disposed in the second and third through-holes 110HB and 110HC, respectively.

Figure 13C:
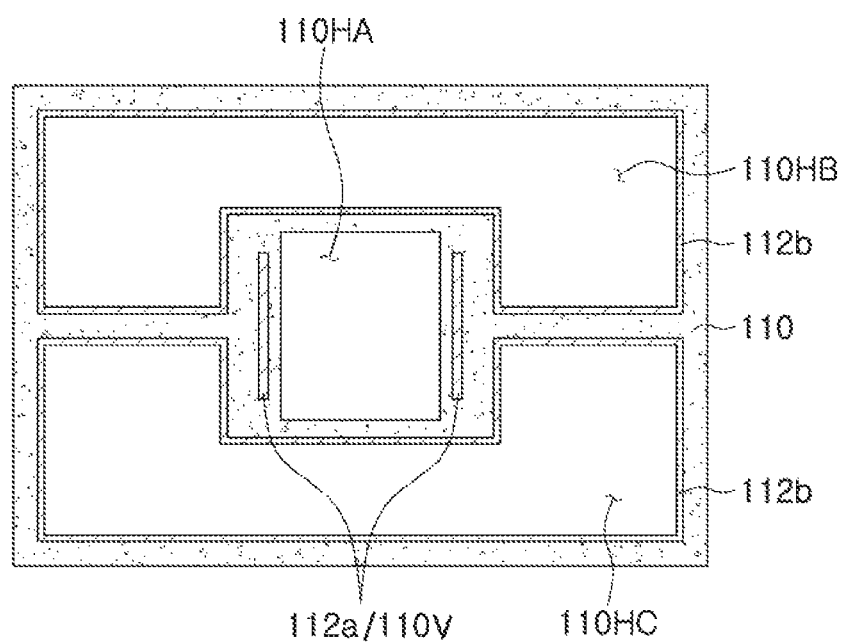

Referring to FIG. 13C, a core member 110 may have first to third through-holes 110HA, 110HB, and 110HC. In this case, second metal layers 112b may be formed on walls of the second and third through-holes 110HB and 110HC, and a plurality of first metal layers 112a filling slits 110V in the core member 110 may be formed between the first to third through-holes 110HA, 110HB, and 110HC. The plurality of first metal layers 112a may be spaced apart from the second metal layers 112b, respectively. A semiconductor chip 120 may be disposed in the first through-hole 110HA, and a plurality of passive components 125A and 125B may be disposed in the second and third through-holes 110HB and 110HC, respectively.

Figure 13D:
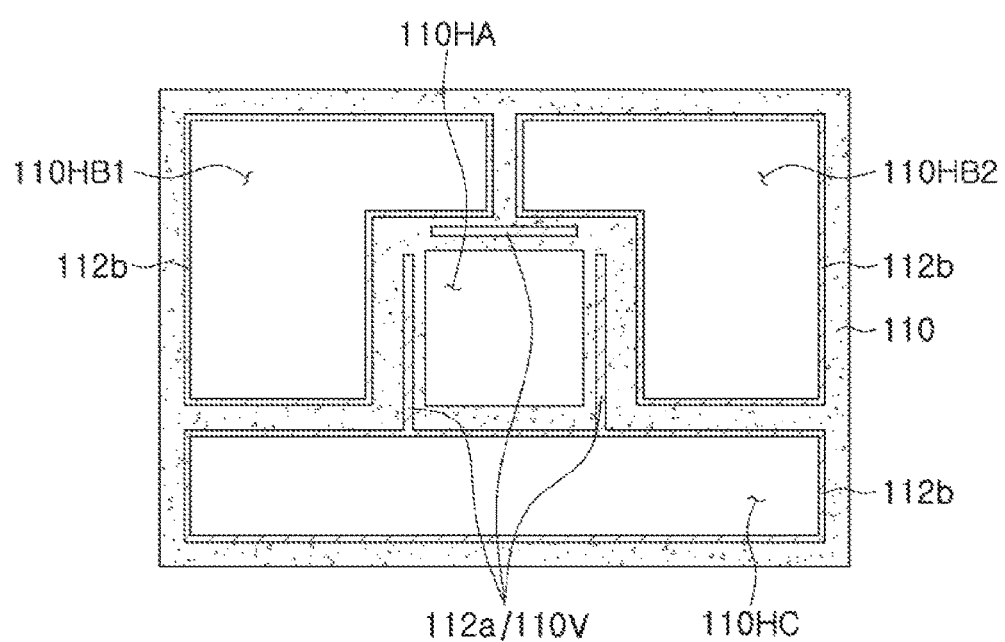

Referring to FIG. 13D, a core member 110 may have first to fourth through-holes 110HA, 110HB1, 110HB2, and 110HC. In this case, second metal layers 112b may be formed on walls of the second to fourth through-holes 110HB1, 110HB2, and 110HC, and a plurality of first metal layers 112a, filling slits 110V in the core member 110 and connected to the second metal layers 112b formed on the walls of the fourth through-hole 110HC, may be formed between the first and second through-holes 110HA and 110HB1 and between the first and third through-hole 110HB2. In addition, first metal layers 112a filling slits 110V in the core member 110 may also be formed between the first to third through-holes 110HA, 110HB1, and 110HB2. The first metal layers 112a disposed between the first to third through-holes 110HA, 110HB1, and 110HB2 may be spaced apart from the second metal layers 112b. A semiconductor chip 120 may be disposed in the first through-hole 110HA, and a plurality of passive components 125A and 125B may be disposed in the second to fourth through-holes 110HB1, 110HB2, and 110HC, respectively.

Figure 13E:
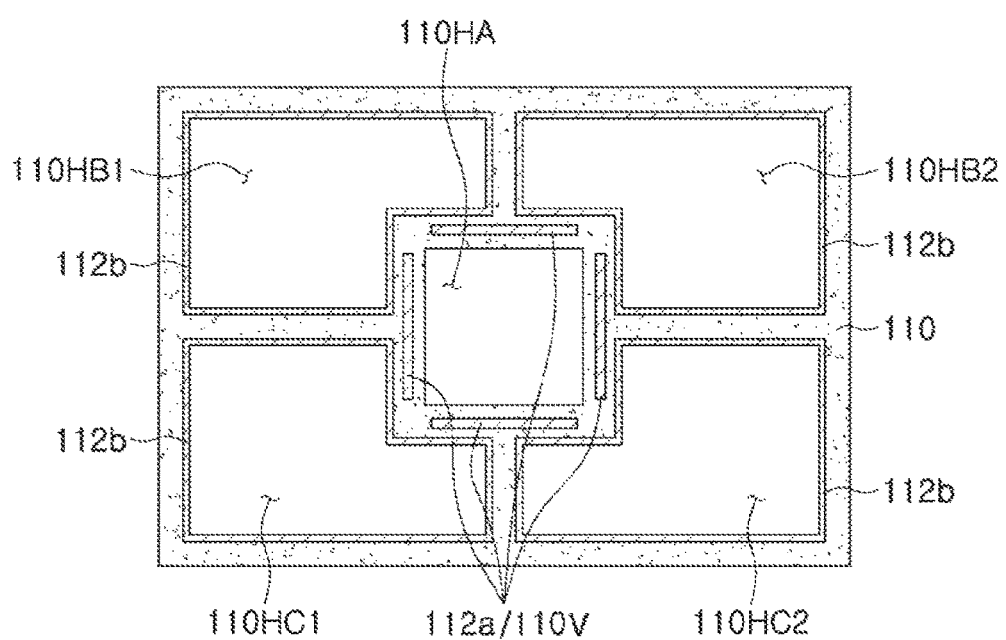

Referring to FIG. 13E, a core member 110 may have first to fifth through-holes 110HA, 110HB1, 110HB2, 110HC1, and 110HC2. In this case, second metal layers 112b may be formed on walls of the second to fifth through-holes 110HB1, 110HB2, 110HC1, and 110HC2. In addition, a plurality of first metal layers 112a filling slits 110V in the core member 110 and spaced apart from each other may also be formed between the first to fifth through-holes 110HA, 110HB1, 110HB2, 110HC1, and 110HC2. The plurality of first metal layers 112a may be spaced apart from the second metal layers 112b, respectively. A semiconductor chip 120 may be disposed in the first through-hole 110HA, and a plurality of passive components 125A and 125B may be disposed in the second to fifth through-holes 110HB1, 110HB2, 110HC1, and 110HC2, respectively.

Figure 13F:
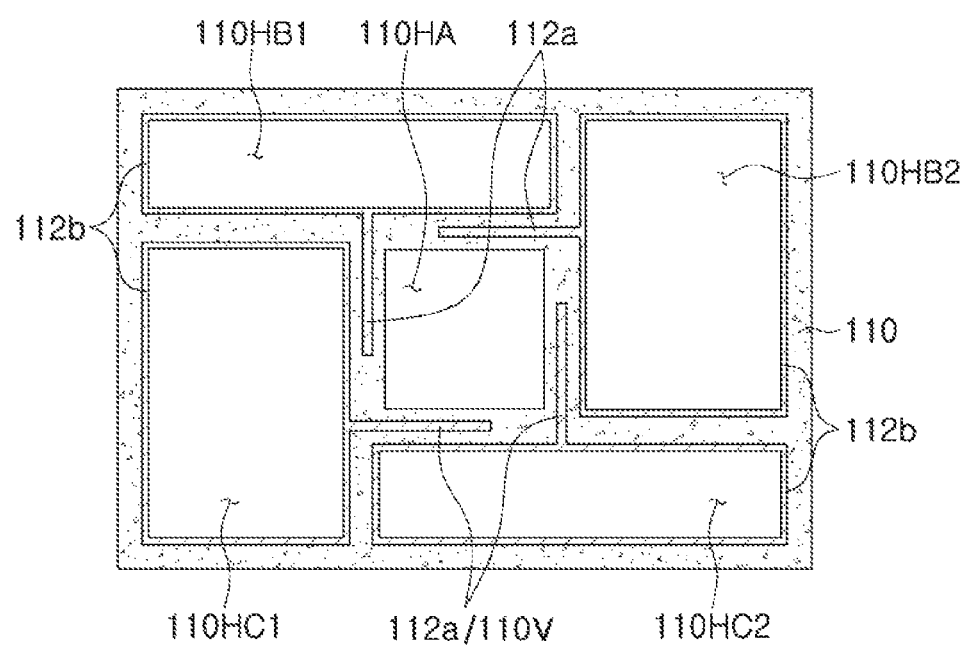

Referring to FIG. 13F, a core member 110 may have first to fifth through-holes 110HA, 110HB1, 110HB2, 110HC1, and 110HC2. In this case, second metal layers 112b may be formed on walls of the second to fifth through-holes 110HB1, 110HB2, 110HC1, and 110HC2. In addition, a plurality of first metal layers 112a, filling slits 110V in the core member 110 and spaced apart from each other, may also be formed between the first to fifth through-holes 110HA, 110HB1, 110HB2, 110HC1, and 110HC2. The plurality of first metal layers 112a may be connected, respectively, to the second metal layers 112b formed in the second to fifth through-holes 110HB1, 110HB2, 110HC1, and 110HC2. A semiconductor chip 120 may be disposed in the first through-hole 110HA, and a plurality of passive components 125A and 125B may be disposed in the second to fifth through-holes 110HB1, 110HB2, 110HC1, and 110HC2, respectively.

Figure 13G:
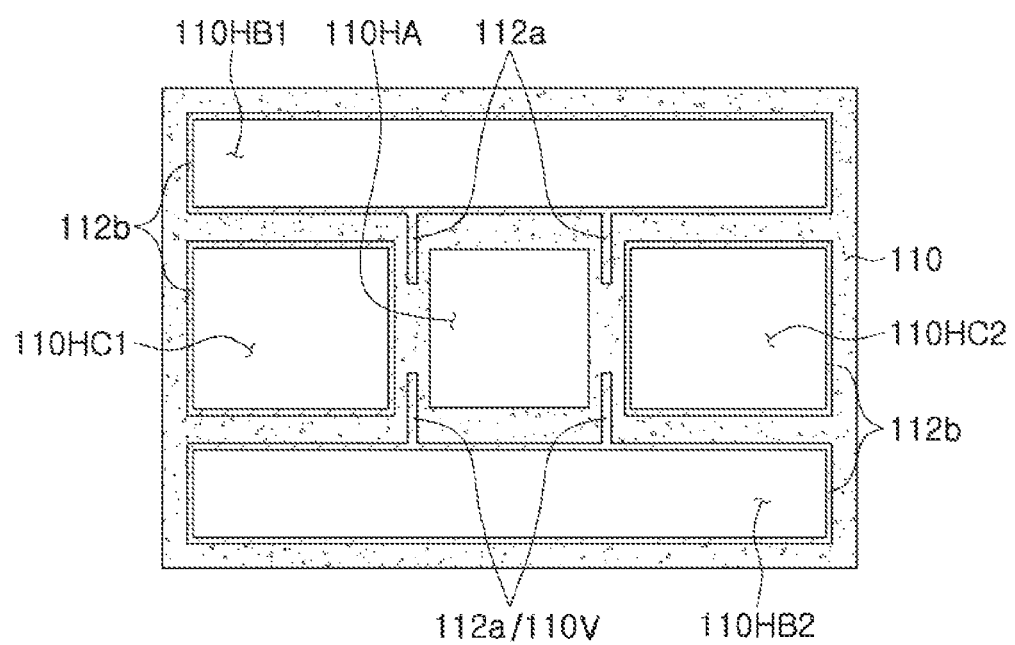
Figure 13H:
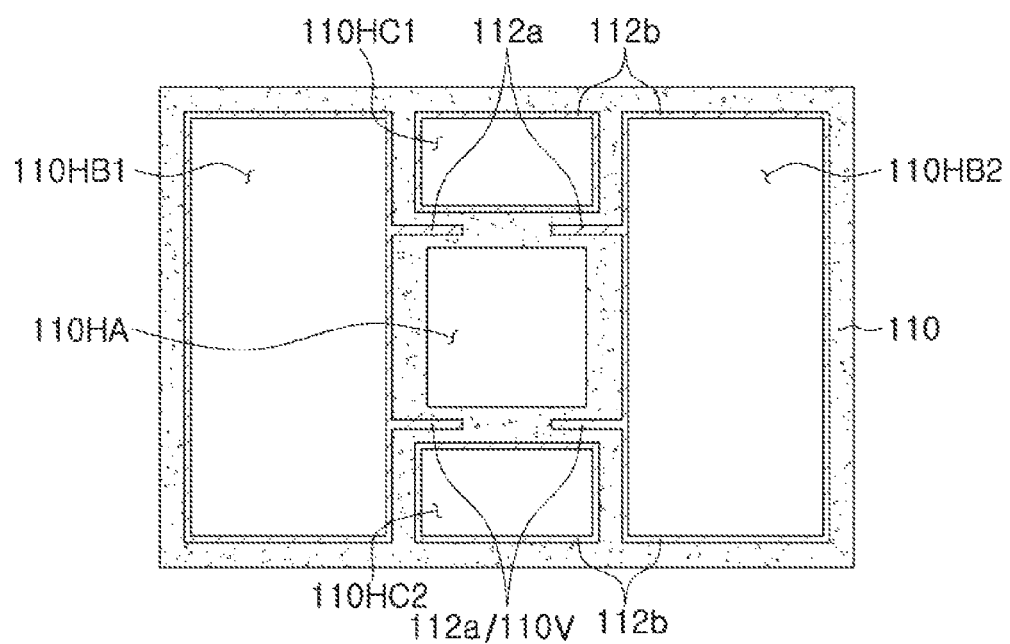

Referring to FIGS. 13G and 13H, a core member 110 may have first to fifth through-holes 110HA, 110HB1, 110HB2, 110HC1, and 110HC2. In this case, second metal layers 112b may be formed on walls of the second to fifth through-holes 110HB1, 110HB2, 110HC1, and 110HC2. In addition, a plurality of first metal layers 112a filling slits 110V in the core member 110 may also be formed between the first and fourth through-holes 110HA and 110HC1 and between the first and fifth through-holes 110HA and 110HC2, respectively. The plurality of first metal layers 112a may be connected, respectively, to the second metal layers 112b formed on the walls of the second and third through-holes 110HB1 and 110HB2. A semiconductor chip 120 may be disposed in the first through-hole 110HA, and a plurality of passive components 125A and 125B may be disposed in the second to fifth through-holes 110HB1, 110HB2, 110HC1, and 110HC2, respectively.

Figure 14:
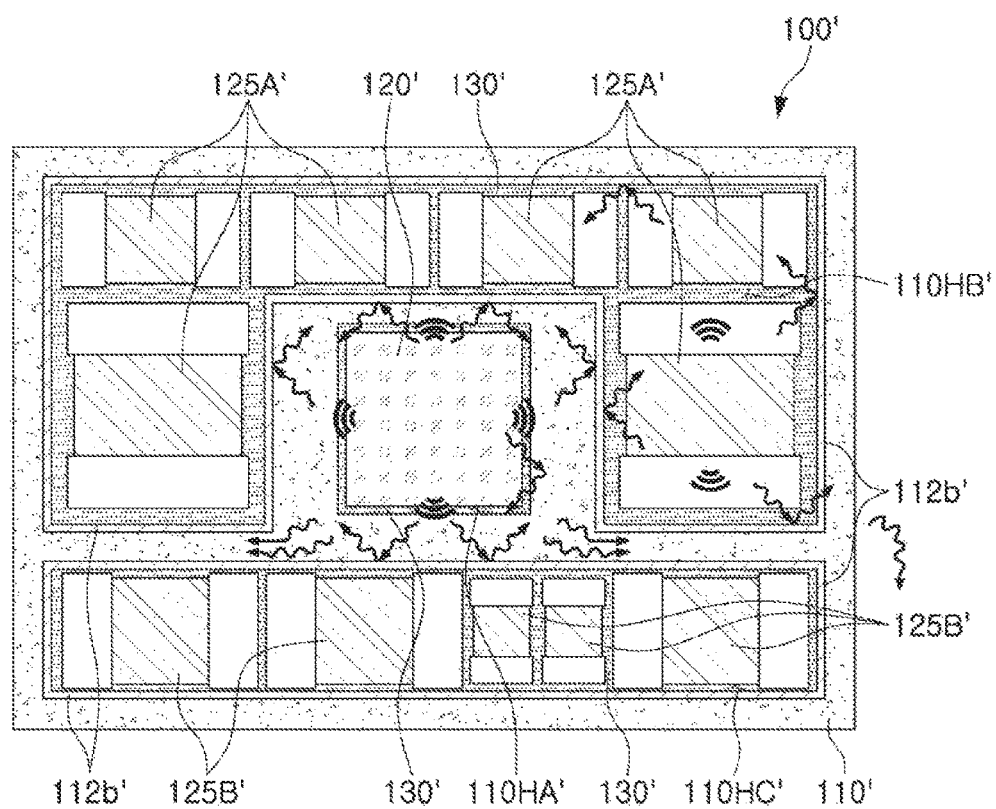
FIGS. 14 and 15 are schematic plan views illustrating an effect depending on whether or not slits filled with a metal layer of the core member of the fan-out semiconductor package module of FIG. 9 exist.
Figure 15:
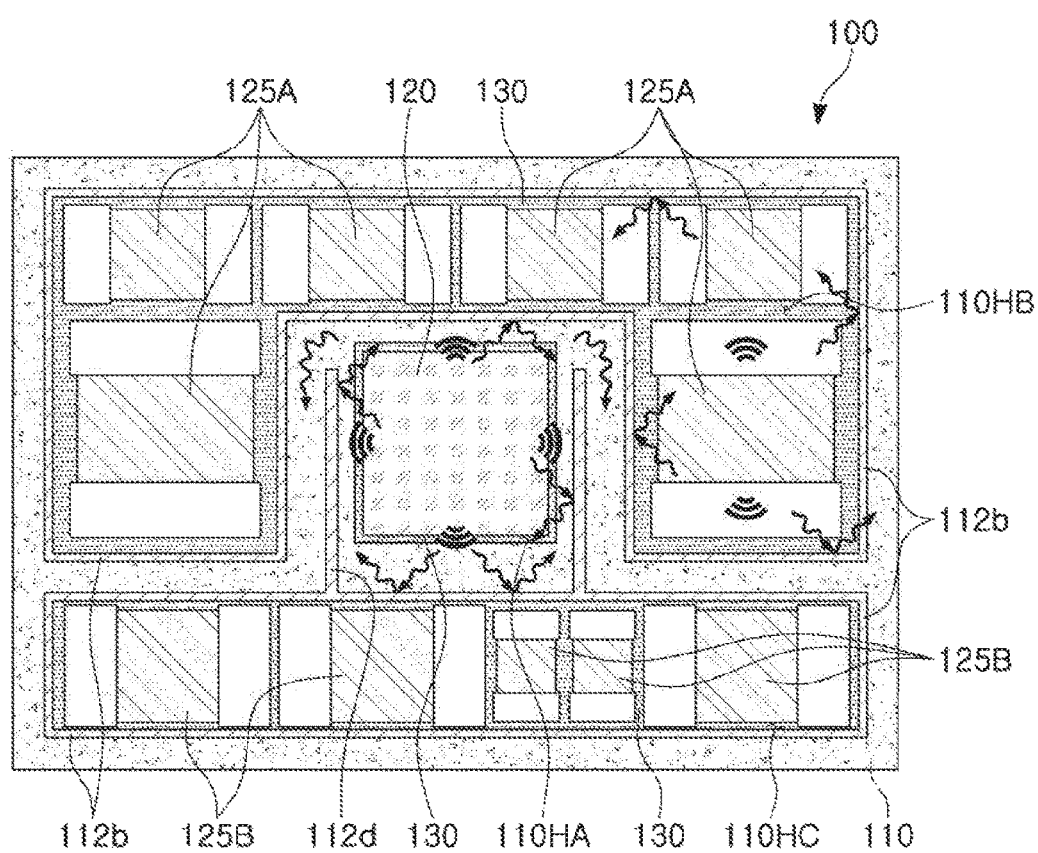

FIGS. 14 and 15 are schematic plan views illustrating an effect depending on whether or not slits filled with a metal layer of the core member of the fan-out semiconductor package module of FIG. 9 exist. A fan-out semiconductor package module 100' shown in FIG. 14 is substantially the same as the fan-out semiconductor package module 100 shown in FIG. 9 or FIG. 15, except that slits filled with a metal layer of a core member 110' do not exist. Reference characters with an apostrophe shown in FIG. 14 correspond to the above-described reference characters without an apostrophe. A description of the fan-out semiconductor package module 100' shown in FIG. 14 thus will be omitted to avoid redundancy.

As compared to the fan-out semiconductor package module 100' shown in FIG. 14, the fan-out semiconductor package module 100 shown in FIG. 15 allows a lower level of EMI noise generated by the semiconductor chip 100 and/or the first and second passive components 125A and 125B to leak from the fan-out semiconductor package module 100, because the first metal layers 112a effectively prevent the EMI noise from leaking through a passage between the second and third through-holes 110HB and 110HC. As such, the EMI noise from the fan-out semiconductor package module 100 may have less influence on external devices outside the fan-out semiconductor package module 100 or a user having an electronic device implemented with the fan-out semiconductor package module 100.

As set forth above, according to the exemplary embodiment in the present disclosure, a fan-out semiconductor package module in which a mounting area may be significantly reduced, electrical paths between a semiconductor chip and a plurality of passive components may be significantly reduced, and EMI may be easily blocked through plating by disposing and modularizing the plurality of passive components together with the semiconductor chip in a single package may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package module comprising:
a core member having first and second through-holes spaced apart from each other and one or more slits;
a semiconductor chip disposed in the first through-hole and having an active surface having connection pads disposed thereon and an inactive surface opposing the active surface;
one or more first passive components disposed in the second through-hole;
an encapsulant encapsulating at least portions of each of the core member, the inactive surface of the semiconductor chip, and the one or more first passive components;
a connection member disposed on the core member, the active surface of the semiconductor chip, and the one or more first passive components and including redistribution layers electrically connected to the connection pads and the one or more first passive component; and
first metal layers filling the one or more slits,
wherein at least one of the one or more slits is formed between the first and second through-holes.

2. The fan-out semiconductor package module of claim 1, further comprising second metal layers disposed on walls of the second through-hole.

3. The fan-out semiconductor package module of claim 2, wherein the first metal layer filling the at least one slit formed between the first and second through-holes is connected to the second metal layer.

4. The fan-out semiconductor package module of claim 2, wherein the first metal layer filling the at least one slit formed between the first and second through-holes is spaced apart from the second metal layer.

5. The fan-out semiconductor package module of claim 2, further comprising a third metal layer disposed on an upper surface of the core member.

6. The fan-out semiconductor package module of claim 5, wherein the third metal layer is connected to the first and second metal layers.

7. The fan-out semiconductor package module of claim 5, further comprising a backside metal layer disposed on the encapsulant,
wherein the backside metal layer is connected to the third metal layer through backside vias penetrating through at least portions of the encapsulant.

8. The fan-out semiconductor package module of claim 2, further comprising a fourth metal layer disposed on a lower surface of the core member.

9. The fan-out semiconductor package module of claim 8, wherein the fourth metal layer is connected to the first and second metal layers.

10. The fan-out semiconductor package module of claim 9, wherein the connection member includes an electromagnetic interference (EMI) blocking structure surrounding the redistribution layers, and
the fourth metal layer is connected to the EMI blocking structure.

11. The fan-out semiconductor package module of claim 1, wherein the connection member includes a heat dissipation structure disposed on the active surface of the semiconductor chip.

12. The fan-out semiconductor package module of claim 1, wherein the encapsulant fills at least portions of each of the first and second through-holes.

13. The fan-out semiconductor package module of claim 12, wherein walls of the first through-hole are in contact with the encapsulant.

14. The fan-out semiconductor package module of claim 1, wherein the core member further has a third through-hole spaced apart from the first and second through-holes, and
one or more second passive components are disposed in the third through-hole.

15. The fan-out semiconductor package module of claim 14, wherein at least the other of the one or more slits is formed between the first and third through-holes.

16. The fan-out semiconductor package module of claim 14, further comprising:
second metal layers disposed on walls of the second and third through-holes;
a third metal layer disposed on an upper surface of the core member; and
a fourth metal layer disposed on a lower surface of the core member.

* * * * *